(12) United States Patent
Jiang et al.

(10) Patent No.: US 10,008,690 B2
(45) Date of Patent: Jun. 26, 2018

(54) METHOD AND SYSTEM OF FLATTENING A SURFACE FORMED BY SEALANT OF PACKAGING COVER PLATE, AND PACKAGING METHOD

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Zhiliang Jiang, Beijing (CN); Minghua Xuan, Beijing (CN); Renrong Gai, Beijing (CN); Bo Zhang, Beijing (CN); Fei Chen, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days. days.

(21) Appl. No.: 14/743,472

(22) Filed: Jun. 18, 2015

(65) Prior Publication Data
US 2016/0225800 A1    Aug. 4, 2016

(30) Foreign Application Priority Data
Jan. 30, 2015   (CN) .......................... 2015 1 0052001

(51) Int. Cl.
*C03C 25/68*    (2006.01)
*H01L 51/52*    (2006.01)
(Continued)

(52) U.S. Cl.
CPC .... *H01L 51/5246* (2013.01); *H01L 21/02675* (2013.01); *H01L 21/02686* (2013.01); *H01L 21/428* (2013.01); *H01L 21/449* (2013.01)

(58) Field of Classification Search
CPC ......... H01L 21/02675; H01L 21/02686; H01L 21/428; H01L 21/449; H01L 21/463; H01L 2021/607
(Continued)

(56) References Cited

U.S. PATENT DOCUMENTS 5,569,502 A * 10/1996 Koinuma ................ C23C 16/24
                                                       427/248.1
7,115,446 B2 * 10/2006 Koo ....................... H01L 21/563
                                                       257/669
(Continued)

OTHER PUBLICATIONS

Wikipedia, the Free Encyclopedia, "Ultrasound" via https://en.wikipedia.org/wiki/Ultrasound ; pp. 1-14; 2016.*
(Continued)

*Primary Examiner* — Binh X Tran
(74) *Attorney, Agent, or Firm* — Kinney & Lange, P.A.

(57) ABSTRACT

The present invention discloses a method and a system of flattening a surface formed by sealant of a packaging cover plate, as well as a packaging method, the method includes vibrating a high temperature sintered packaging cover plate by using a high frequency vibrator with a preset frequency, and irradiating the surface formed by sealant of the packaging cover plate by using a laser with preset power, so that a convex portion formed by the sealant is melted and flows to a concave portion formed by the sealant under vibration of the high frequency vibrator, thereby flattening the surface formed by sealant of the packaging cover plate.

15 Claims, 4 Drawing Sheets

(51) Int. Cl.
*H01L 21/428* (2006.01)
*H01L 21/02* (2006.01)
*H01L 21/449* (2006.01)

(58) Field of Classification Search
USPC .......................... 216/67; 427/554, 557, 560
See application file for complete search history.

(56) References Cited

U.S. PATENT DOCUMENTS

| 7,356,907 B2* | 4/2008 | Kobae ................... G11B 5/4833 |
| | | 219/68 |
| 2001/0021594 A1* | 9/2001 | Yoo .................... H01L 21/76819 |
| | | 438/784 |
| 2013/0239622 A1* | 9/2013 | Haase Pastel ...... H01L 51/5246 |
| | | 65/155 |

OTHER PUBLICATIONS

Ultrasonic Sound via http://hyperphysics.phy-astr.gsu.edu/hbase/Sound/usound.html ; pp. 1-3; no date available.*

* cited by examiner

METHOD AND SYSTEM OF FLATTENING A SURFACE FORMED BY SEALANT OF PACKAGING COVER PLATE, AND PACKAGING METHOD

CROSS-REFERENCE TO RELATED APPLICATION

This application claims the benefit of Chinese Patent Application No. 201510052001.5 filed on Jan. 30, 2015 in the State Intellectual Property Office of China, the whole disclosure of which is incorporated herein by reference.

BACKGROUND OF THE INVENTION

Technical Field

Embodiments of the present invention generally relate to the field of display technology, and in particular, relate to a method and a system of flattening a surface formed by sealant of a packaging cover plate, and a packaging method.

Description of the Related Art

In the field of current display devices, performance of a display device is more focused on. In particular, for an organic light emitting diode OLED display device, lifetime becomes a critical factor. However, the main reason for this defect is in that a metal cathode of low work function and an organic functional layer in the device are very sensitive to water and oxygen in environment and easily interact with oxygen and water, resulting in degraded performance of the device. Therefore, packaging process of the OLED device becomes critical process for improving lifetime of the OLED display device.

However, since material of sealant used in packaging process is mainly composed of UV curing adhesive glue and glass glue, which glass glue is composed of inorganic glass material and organic matter (organic solvent and resin), a screen printing method is generally applied to screen print glass glue onto a package substrate, and then organic matter in the glass glue is removed after pre-sintering process and high temperature sintering process. In actual production process, the high temperature sintering process will destroy structure of a surface formed by sealant so that the surface is uneven, resulting in many visible steps. Due to the uneven thickness of the sealant, laser energy required for melting the sealant is not constant, and stress easily occurs during packaging process; meanwhile, sealability is insufficient after packaging due to the visible steps.

SUMMARY OF THE INVENTION

Embodiments of the present invention provide a method and a system of flattening a surface formed by sealant of a packaging cover plate as well as a packaging method, for solving a technical problem present in the prior arts that subsequent packaging process will be adversely affected due to the uneven surface formed by sealant of the packaging cover plate after sintered at high temperature.

According to one aspect of the present invention, there is provided a method for flattening a surface formed by sealant of a packaging cover plate, the surface comprising a convex portion and a concave portion formed by the sealant, the method comprising steps of:

placing the packaging cover plate after being high temperature sintered on a high frequency vibrator with a preset frequency, so that a side of the packaging cover plate on which sealant is not screen printed is attached onto a surface of the high frequency vibrator; and controlling at least one laser with preset power to irradiate the surface formed by screen printed sealant of the packaging cover plate, so that the convex portion of the surface formed by screen printed sealant is melted, and the melted sealant at the convex portion flows to the concave portion under vibration of the high frequency vibrator, thereby flattening the surface formed by screen printed sealant of the packaging cover plate.

In above method, the step of controlling at least one laser with preset power to irradiate the surface formed by screen printed sealant of the packaging cover plate may comprise: controlling two lasers with preset power to irradiate the surface formed by screen printed sealant of the packaging cover plate, wherein the two lasers are respectively aligned with the convex portion and the concave portion of the surface formed by screen printed sealant of the packaging cover plate, an extending direction of the lasers is parallel to the surface of the packaging cover plate, and the two lasers move in the same and constant speed along the packaging cover plate.

In above method, heights of the lasers may be adjustable so that after the highest convex portion is irradiated and melted, other convex portions are irradiated and melted by the lasers.

In above method, the step of controlling two lasers with preset power to irradiate the surface formed by screen printed sealant of the packaging cover plate may comprise:

using a step profiler to map out an image of the surface formed by screen printed sealant in real time so as to obtain height value of the convex portions and the concave portions, and determining the heights of the lasers respectively according to the height values of the convex portion and the concave portion; and using a regulator to adjust the heights of the two lasers respectively according to the determined height of the two lasers with preset power, so that the convex portion of the surface formed by screen printed sealant is sufficiently melted.

In above method, the step of using a step profiler to map out an image of the surface formed by screen printed sealant in real time so as to obtain height value of the convex portions and the concave portions may comprise: obtaining the height value of the highest convex portion and the height value of the lowest concave portion of the surface formed by screen printed sealant of the packaging cover plate, and then transmitting them to the regulator.

In above method, the step of adjusting the heights of the two lasers with preset power may comprise: adjusting the height of one laser to be the same as the height of the highest convex portion of the surface formed by screen printed sealant and adjusting the height of the other laser to be the same as the height of the lowest concave portion of the surface formed by screen printed sealant.

In above method, the preset power of the laser may 5 to 60 watts.

In above method, the high frequency vibrator may be an ultrasonic vibrator with a vibration frequency range of 15 to 45 Hz.

In above method, the moving speed of the laser may be 23 mm/min.

According to another aspect of the present invention, there is provided a surface planarization processing system, comprising a high frequency vibrator and at least one laser with preset power; wherein, said at least one laser is configured to irradiate a surface formed by screen printed sealant of a high temperature sintered packaging cover plate, so that a convex portion of the surface formed by screen printed sealant is melted; and the high frequency vibrator is configured to carry the packaging cover plate and to vibrate the packaging cover plate, so that the melted sealant flows to a concave portion of the surface formed by screen printed sealant, thereby flattening the surface formed by screen printed sealant of the packaging cover plate.

Preferably, the system may comprise two lasers with preset power, wherein said two lasers are configured to be respectively aligned with the convex portion and the concave portion of the surface formed by screen printed sealant of the packaging cover plate, an extending direction of the lasers is parallel to the surface of the packaging cover plate, and the two lasers are further configured to move in the same and constant speed along the packaging cover plate.

The above system may further comprise:

a step profiler for mapping out an image of the surface formed by screen printed sealant in real time so as to obtain height values of the convex portion and the concave portion of the surface, and determining the heights of the two lasers respectively according to the height values of the convex portion and the concave portion; and a regulator for adjusting the heights of the two lasers respectively according to the determined height of the two lasers, so that the convex portion of the surface formed by screen printed sealant is sufficiently melted.

In above system, the preset power of the laser may be 5 to 60 watts.

In above system, the high frequency vibrator may be an ultrasonic vibrator with a vibration frequency range of 15 to 45 Hz.

In above system, the moving speed of the laser may be 23 mm/min.

According to further another aspect of the present invention, there is provided a packaging cover plate, comprising a package substrate and sealant, wherein the surface of the sealant is flattened by above method.

According to further another aspect of the present invention, there is provided a packaging method, comprising:

pre-sintering and high temperature sintering a package substrate with sealant screen printed thereon to obtain a packaging cover plate;

flattening a surface formed by screen printed sealant, of the packaging cover plate by the above method; and aligning and assembling the flattened packaging cover plate with a TFT array substrate, and packaging the assembled packaging cover plate and TFT array substrate.

Before the step of pre-sintering and high temperature sintering the package substrate with sealant screen printed thereon, the method may further comprise: cleaning and drying the package substrate; and screen printing the sealant on the dried package substrate by using a screen printing process.

In the embodiments of the present invention, the packaging cover plate after being high temperature sintered is vibrated by using a high frequency vibrator with a preset frequency, as well as a surface formed by screen printed sealant of the packaging cover plate is irradiated by using a laser with a preset power, so that convex portion of the surface is melted and the melted sealant at the convex portion flow to the concave portion under vibration of the high frequency vibrator, thus the surface of the packaging cover plate is flattened. Thus, stress can be prevented from occurring in subsequent packaging processes, while sealability of the overall packaging cover plate is improved due to the whole even or planar surface formed with by sealant of the packaging cover plate.

BRIEF DESCRIPTION OF THE DRAWINGS

In order to more clearly illustrate the technical solution in the present embodiments, the accompanying drawings used in the present embodiments will be briefly described as follows, the described drawings are obviously only some embodiments of the invention, and based on these drawings, other drawings could also be obtained by the person skilled in the art without creative work.

FIGS. 8(a)-8(b) are schematic diagrams showing operation process of irradiating the sealant of the packaging cover plate located on an ultrasonic vibrator by using a laser;

DETAILED DESCRIPTION OF PREFERRED EMBODIMENTS OF THE INVENTION

In order to make the objectives, technical solutions and advantages of the present invention more clear, the present invention will be described hereinafter in detail with reference to the attached drawings, it is obvious that the descried embodiments are only parts of the embodiments of the present invention, but not all embodiments. Based on the embodiments of the present invention, any other embodiment, which is obtained based on the descried embodiments by the person skilled in the art without creative work, falls within the protection scope of the present invention.

In embodiments of the present invention, the packaging cover plate after being high temperature sintered is vibrated by using a high frequency vibrator with a preset frequency, as well as a surface formed by screen printed sealant of the packaging cover plate is irradiated by using a laser with preset power, so that a convex portion of the surface is melted and the melted sealant at the convex portion flows to a concave portion of the surface under vibration of the high frequency vibrator, thus the surface of the packaging cover plate is flattened. Thus, stress can be prevented from occurring in subsequent packaging process, while sealability of the overall packaging cover plate is improved due to the whole even or planar surface formed by sealant of the packaging cover plate.

The technical solutions of the present invention will be described with reference to the following specific embodiments, and it should be noted that the present invention include, but is not limited to, the following embodiments.

Figure 1:
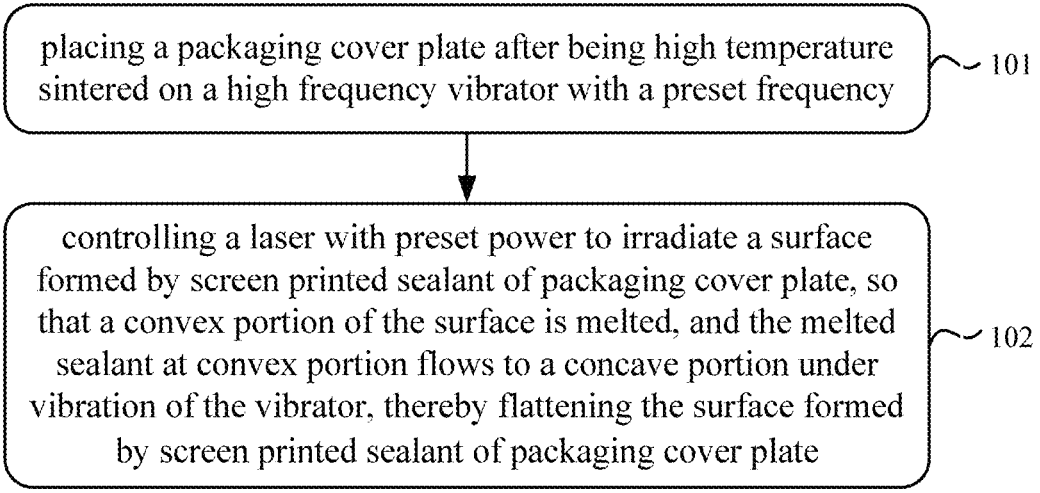
FIG. 1 is a flowchart of a method for flattening a surface formed by sealant of packaging cover plate according to embodiments of the present invention.

FIG. 1 is a flow chart of a method for flattening a surface formed by sealant of a packaging cover plate according to embodiments of the present invention; the method comprises the following steps:

In Step 101, a packaging cover plate after sintered at high temperature is placed on a high frequency vibrator with a preset frequency, wherein a side of the high temperature sintered packaging cover plate on which no sealant is screen printed is attached on a surface of the high frequency vibrator.

Figure 2:
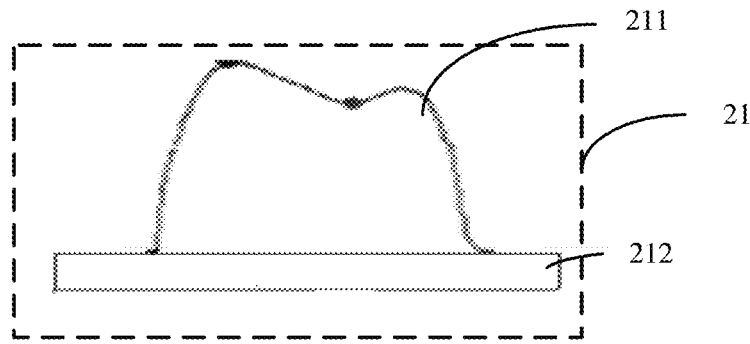
FIG. 2 is a structural schematic diagram of packaging cover plate after being high temperature sintered according to embodiments of the present invention.

FIG. 2 is a structural schematic diagram of packaging cover plate 21 after being high temperature sintered according to embodiments of the present invention. Referring to FIG. 2, the high temperature sintered packaging cover plate 21 includes a sealant 211 and a package substrate 212; in order to properly show that a surface of the sealant 211 after high temperature sintering process is uneven, and includes a convex portion and a concave portion with height differences or steps therebetween, a partially enlarged view of a panel as the cover package is only shown in FIG. 2; the entire panel needs to be flattened in the actual production process. As shown in FIG. 2, these height differences or steps may be not obvious with respect to the overall packaging cover plate, but there is great influences on strict packaging processes; especially when the packaging cover plate 21 is viewed in the enlarged view, the height differences or steps on the surface of the sealant 211 is quite large, which doe no facilitate alignment and assembly of the packaging cover plate with the TFT array substrate. Among others, the package substrate used in the present invention may be a silicide structure, such as packaging glass.

Figure 3:
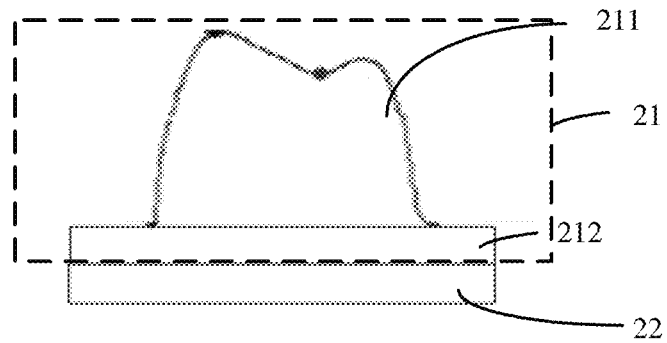
FIG. 3 is a schematic diagram of a high frequency vibrator according to embodiments of the present invention, on which a packaging cover plate after being high temperature sintered is attached.

In one embodiment of the present invention, as shown in FIG. 3, the packaging cover plate 21 shown in FIG. 2 is placed upside down on a high frequency vibrator 22 with a preset frequency, a surface of the high frequency vibrator 22 is flat, so that one side of the high temperature sintered packaging cover plate 21 with screen printed sealant 211 is located away from the surface of the high frequency vibrator 22, and the other side contacts with the flat surface of the high frequency vibrator 22.

Preferably, the high-frequency vibrator 22 in FIG. 3 may be an ultrasonic vibrator with a vibration frequency range of 15 to 45 Hz. In addition, the high-frequency vibrator 22 may also other vibrators which can produce the same vibration effect, which will be not exemplified one by one in the present invention.

In Step 102, at least one laser with preset power is controlled by using a regulator to irradiate the surface formed by screen printed sealant of the high temperature sintered packaging cover plate, so that the convex portion of the surface formed by screen printed sealant is melted, and the melted sealant at the convex portion flows to the concave portion under vibration of the high frequency vibrator, the surface formed by screen printed sealant of the packaging cover plate is accordingly flattened.

Figure 4:
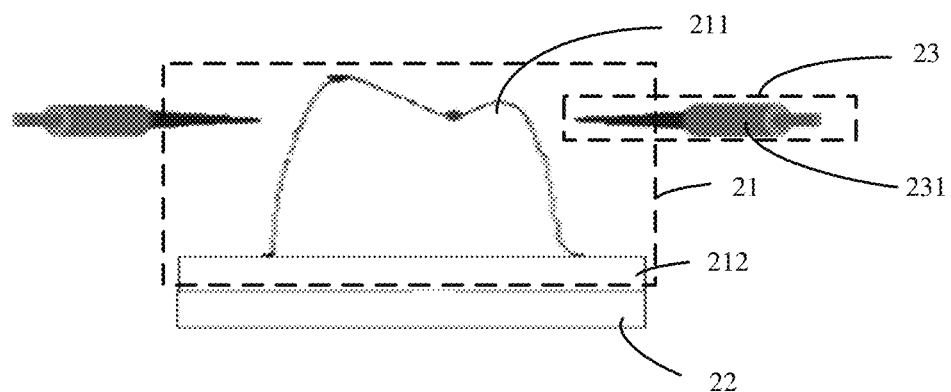
FIG. 4 is a simple schematic view showing the state on which the packaging cover plate according to the present invention embodiment is irradiated on the high frequency vibrator by a laser.
Figure 5:
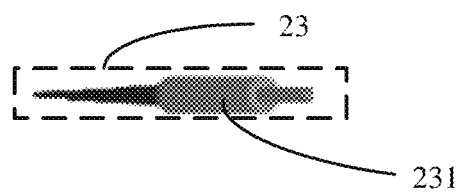
FIGS. 5 (a) and 5 (b) illustrate two lasers with different structures.
Figure 5:
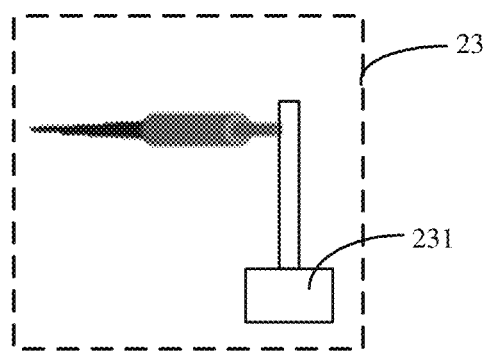

In this step, as shown in FIG. 4, at least one laser 23 with preset power is added on the basis of the arrangement shown in FIG. 3. Since the sealant 211 is made of a mixture of UV curable adhesive and glass paste, it will be melted if it is irradiated by laser with a certain frequency. Accordingly, a regulator 231 is used in the present invention to control the at least one laser 23 to irradiate the surface formed by the screen printed sealant 211 of the high temperature sintered packaging cover plate, so that convex portion of the surface formed by the screen printed sealant 211 is melted, and the melted sealant at the convex portion flows to the concave portion under vibration of the high frequency vibrator 22, and the surface formed by the screen printed sealant 211 of the packaging cover plate 21 is accordingly flattened, wherein the regulator 231 may be a part of the laser 23, that is, may be integrated in the laser 23, as shown in 5 (a); or, the regulator 231 may be a separate structural unit, as shown in FIG. 5 (b).

It is noted that in embodiments of the present invention, the laser 23 may be a device which is capable of emitting a laser beam, and its specific structure is not limited herein; in order to achieve a good technical effect, that is, a better flattening effect, a laser capable of emitting thinner laser light will be chosen for the present invention.

Preferably, the regulator 231 controls the at least one laser 23 to irradiate the surface formed by the screen printed sealant 211 of the high temperature sintered packaging cover plate 21. In particular, with reference to FIG. 6, the regulator 231 controls two lasers 232 and 233 with preset power to irradiate the surface formed by the screen printed sealant 211 of the high temperature sintered packaging cover plate 21, wherein the two lasers 233 and 232 are respectively aligned with the convex portion and the concave portion of the surface formed by the screen printed sealant 211 of the high temperature sintered packaging cover plate 21, and the extending direction of the laser beam emitted by the lasers 233 and 232 is parallel to the surface of the packaging cover plate 21; the two lasers 233 and 232 move at the same and constant speed along the packaging cover plate 21.

Figure 7:
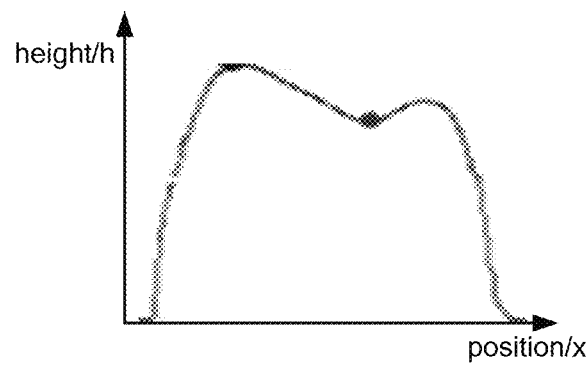
FIG. 7 is an image of the surface formed by sealant mapped out by a step profiler.

Preferably, the regulator 231 may control the laser 23 in the following way: a step profiler 24 is used to map out the image of the surface formed by the screen printed sealant 211 in real time, as shown in FIG. 7. FIG. 7 is a schematic diagram of the image of the surface of the sealant 211 at the current location, which is mapped out by the step profiler 24; heights of the two lasers are determined respectively based on height values of the convex portion and the concave portion acquired from the image; the regulator 231 adjusts respectively the heights of the two lasers 233 and 232 based on the heights of the two lasers determined by the step profiler, so that the convex portion of the surface formed by the screen printed sealant 211 is sufficiently melted.

Preferably, the preset power of each of the lasers in the present invention is 5 to 60 watts.

Preferably, the moving speed of the lasers of the present invention is 23 mm/min.

Next, the technical solutions of the present invention will described in detail with reference to several specific examples, preferably, taking the following case as an example: the highest convex portion and the lowest concave portion in the sealant are irradiated by laser beam emitted from the laser(s).

Example 1: One Laser Arrangement

Figure 8:
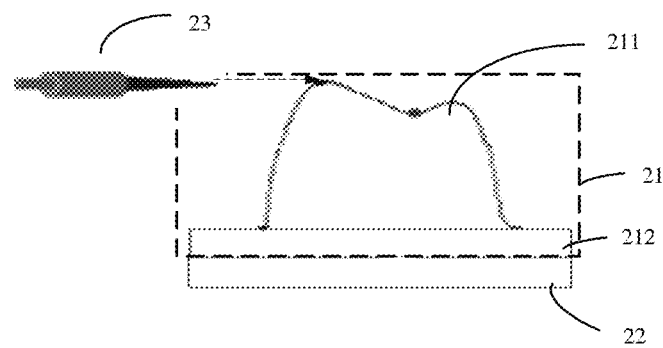
FIG. 8 (c) is a schematic diagram of a flattened packaging cover plate according to embodiments of the present invention.
Figure 8:
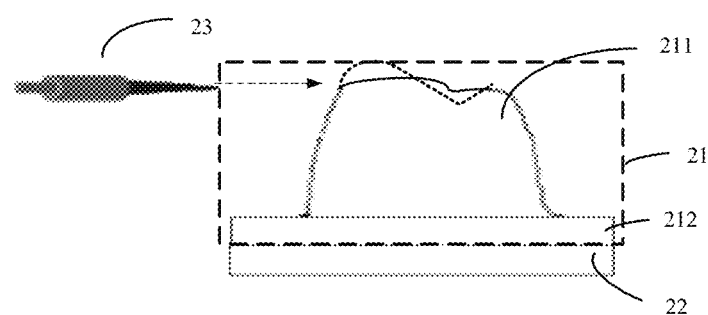
Figure 8:
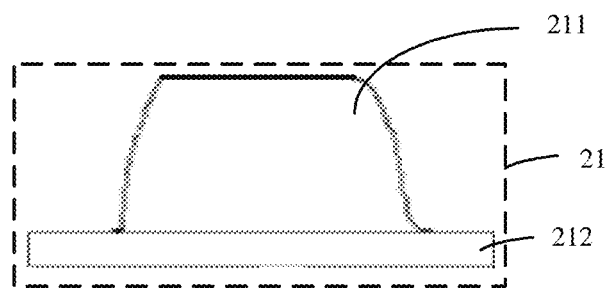

FIGS. 8(a)-8(c) are schematic diagrams showing the flattening operation process in the example 1. Firstly, as shown in FIG. 8(a), the packaging cover plate 21 is placed upside down on an ultrasonic vibrator 22, so that a surface of the package substrate 212 of the packaging cover plate 21, on which surface the sealant 211 is not formed, contacts with a surface of the ultrasonic vibrator 22, while the sealant 211 of the packaging cover plate 21 is exposed to air. The laser 23 is in form of needle, which is parallel to the surface of the package substrate 212, thereby ensuring that the emitted laser beam is parallel to the surface of the package substrate 212 so as to irradiate the concave-convex portions of the sealant 211 of the packaging cover plate 21. The ultrasonic vibrator is controlled to vibrate at a frequency of 30 Hz, and the laser 23 is controlled to irradiate the highest convex portion of the sealant 211 of the packaging cover plate 21 at power of 45 watts while the laser 23 moves around the packaging cover plate 21 at a speed of 23 mm/minute, ensuring that the highest convex portion can be irradiated no matter which orientation the laser moves to.

It should be noted that in embodiments of the present, the height of the laser 23 is adjustable, i.e., the height of the laser beam emitted from the laser 23 is adjustable, so as to ensure that other convex portions are irradiated and melted after the highest convex portion is irradiated and melted. In particular, in order to ensure accuracy for irradiating the convex portions by the laser beam emitted from the laser 23 in the embodiments of the invention, a step profiler is provided for real-time mapping out the packaging cover plate 21 during the flattening process, for real-time capturing the change of the surface (that is, the change in the uneven structure) formed by the screen printed sealant 211 of the packaging cover plate 21 in the current processing operation. Generally, different parameters can be acquired according to the number of the lasers 23; for example, when the number of the laser 23 is one, the step profiler is configured to obtain the height value of the highest convex portion of the surface of the sealant 211 of the current packaging cover plate 31 according to the real-time mapping, and transmit it to the regulator of the laser, and then, the height of the laser is adjusted by means of the regulator; as such, it can be ensured that when the surface of the sealant 211 is changed, the laser 23 can accurately irradiate the changed highest convex portion so as to perform the next stage of the irradiation melting operation. When the number of the lasers 23 is two, the step profiler is configured to obtain the height value of the highest convex portion and the height value of the lowest concave portion of the surface of the sealant 211 of the current packaging cover plate 21 according to the real-time mapping, and then transmit them to regulators of two lasers (one of which is used for irradiating the highest convex portion, and the other one is used for irradiating the lowest concave portion), so that the changed height values can also be obtained in real time so as to ensure the irradiation accuracy of the laser beam emitted by the laser 23.

In the operation shown in FIG. 8(a), the highest convex portion is melted due to the irradiation to the highest convex portion by the laser 23, and at the same time, under the vibration of the ultrasonic vibrator 22, as well as gravity and other factors, the melted sealant flows to and fills the lowest concave portion of the sealant 211 adjacent to the highest convex portion, obtaining the effect shown in FIG. 8(b). In FIG. 8(b), it is shown that the original highest convex portion and the adjacent concave portion disappear and a new highest convex portion emerges. Thus, in the case of real-time mapping by the step profiler, the height of the laser 23 is re-adjusted, in general, adjusted to a height be lower than the previous height, and then, the laser 23 performs the irradiation melting operation for the new highest convex portions based on the adjusted height.

The packaging cover plate 21 is flattened by repeating above process, until no uneven height data presents in the mapping result of the step profiler, namely, the entire surface of the sealant 211 is flat, and the height data become constant; in such a case, the operation of flattening treatment is terminated. Particularly, the finally obtained flattened packaging cover plate 21 would be the structure shown in FIG. 8 (c). It should be noted that since the mapping operation is certainly not completely accurate, and there are some errors; in the embodiments of the present invention, it has tried to map out the image with the minimum error. In the actual production process, the error can be adjusted according to production requirement and production environment limitation.

Example 2: Two Laser Arrangement

In embodiments of the present invention, the flattening process principle for two lasers and even more lasers is similar to that for one laser; hereon e, the effect achieved by two lasers is simply explained with reference to this example.

Figure 6:
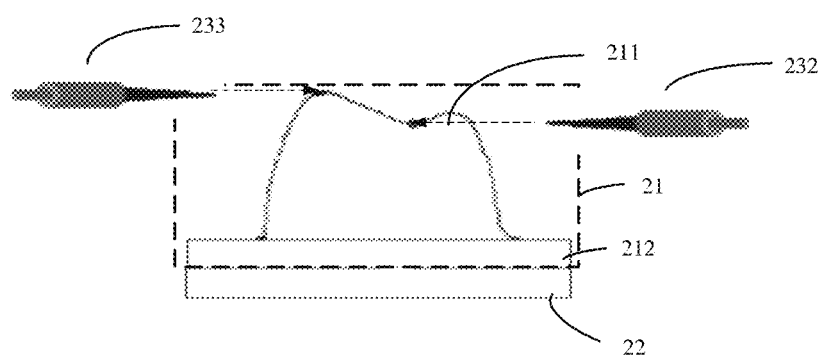
FIG. 6 is a schematic diagram showing irradiation of convex and concave portions of the packaging cover plate by using two lasers respectively, according to embodiments of the present invention.

FIG. 6 is a schematic diagram showing that two lasers 21 are provided to perform flattening process on the packaging cover plate 21; during this process, the height of the laser 232 is same as the height of the highest convex portion of the sealants 211, and the height of the laser 233 is same as the height of the lowest concave portion of the sealants 211. The aim for doing so is to ensure that the sealant between the highest convex portion and the lowest concave portion is melted.

Embodiments of the present invention further provided a packaging cover plate, including a package substrate and sealant, wherein the surface of the sealant is flatten by above flattening method.

Embodiment of the present invention further provides a planarization processing system, with reference to FIG. 4, comprising: a high frequency vibrator 22 and at least one laser 23 with preset power;

The at least one laser 23 is used to irradiate the surface formed by the screen printed sealant 211 of the high temperature sintered packaging cover plate 21, so that the convex portion of the surface is melted;

The high frequency vibrator 22 is used to carry the high temperature sintered packaging cover plate 21, and to vibrate the packaging cover plate 21, so that the melted sealant flows to the concave portion, thus the surface formed by the screen printed sealant 211 of the packaging cover plate 21 is flattened.

Preferably, with reference to FIG. 6, the system comprises two lasers 232 and 233 with preset power, which are respectively aligned with the convex portion and the concave portion of the surface formed by screen printed sealant of the high temperature sintered packaging cover plate, the extending direction of the lasers is parallel to the surface of the packaging cover plate, and the two lasers move in the same and constant speed along the packaging cover plate.

Preferably, the system further comprises: a step profiler for real-time mapping out the image of surface formed by screen printed sealant and determining the heights of the two lasers preset power respectively according to the convex portion and the concave portion; a regulator for adjusting the two lasers respectively according to the heights of the two lasers determined by the step profiler, so that the convex portion of the surface with screen printed sealant is sufficiently melted.

Preferably, the preset power of the lasers is 5 to 60 watts.

Preferably, the high frequency vibrator is an ultrasonic vibrator with a vibration frequency range of 15 to 45 Hz.

Preferably, the moving speed of the lasers is 23 mm/min.

Embodiments of the present invention also provide a packaging method, comprising the method for flattening the surface formed by sealant of the packaging cover plate on which the sealant is formed.

Figure 9:
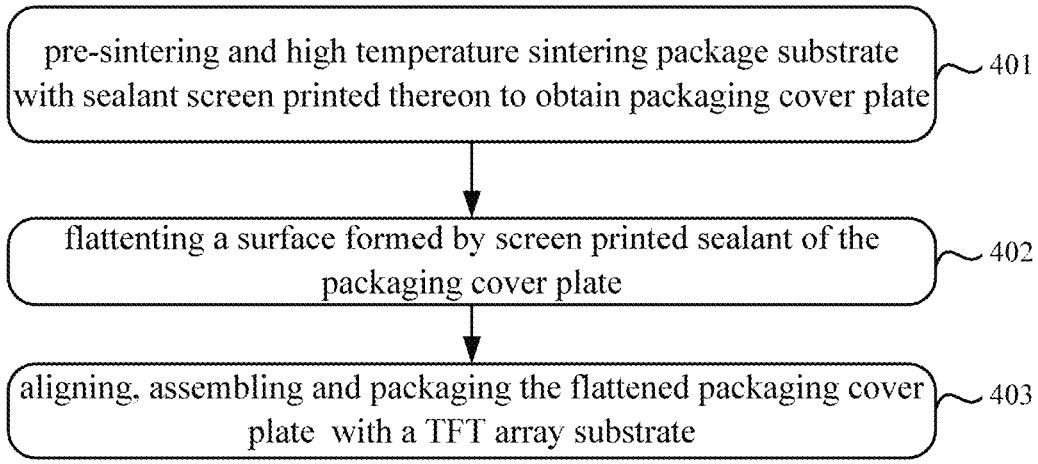
FIG. 9 is a schematic flowchart of a packaging method according to embodiments of the present invention.

FIG. 9 is a schematic flow chart of a packaging method according to embodiments of the present invention. The packaging method includes the following steps:

In Step 401, the package substrate with screen printed sealant is pre-sintered and high temperature sintered so as to obtain a high temperature sintered packaging cover plate.

After the sealant is screen printed to the package substrate, it is pre-sintered (at temperature of about 150° C.) and high temperature sintered (at temperature of 400° C.~550° C.), such that the organics in the sealant is removed, thereby forming the sealant suitable for use in the packaging.

In Step 402, the surface formed by screen printed sealant of the packaging cover plate is flattened.

Since the surface of the high temperature sintered sealant is uneven, and thus the thickness at the sealant of the packaging cover plate is uniform, the laser energy required for melting the uneven portions is not constant during laser packaging, and it is likely to generate stress in the packaging cover plate; further, since the height difference is large, sealability is insufficient after packaging, resulting in that the metal cathode of low work function and organic functional layers in the device interact with water and oxygen in the environment and thus in degraded device performance.

For this reason, the high temperature sintered packaging cover plate is placed on a high frequency vibrator with a preset frequency, so that one side of the high temperature sintered packaging cover plate without screen printed sealant is attached on a surface of the high frequency vibrator; at least one laser with preset power is controlled by using a regulator to irradiate the surface formed by screen printed sealant of the high temperature sintered packaging cover plate, so that convex portion of the surface formed by screen printed sealant is melted and flows to concave portion of the surface under vibration of the high frequency vibrator, thereby the surface formed by screen printed sealant of the packaging cover plate is flattened.

In Step 403, the flattened packaging cover plate is aligned and assembled with a TFT array substrate, and then a packaging process is performed.

After the flattening process of the present invention is performed on the sealant of the packaging cover plate, the packaging cover plate is aligned and assembled with the TFT array substrate, and by using a laser packaging process, the screen printed sealant is melted, and then the packaging cover plate is packaged together with the TFT array substrate. Since the package cover plated is flattened, thereby avoiding the possibility of generating stress, and at the same time, since there is no height difference or step, thereby avoiding the defect of insufficiency of the packaging sealability.

Figure 10:
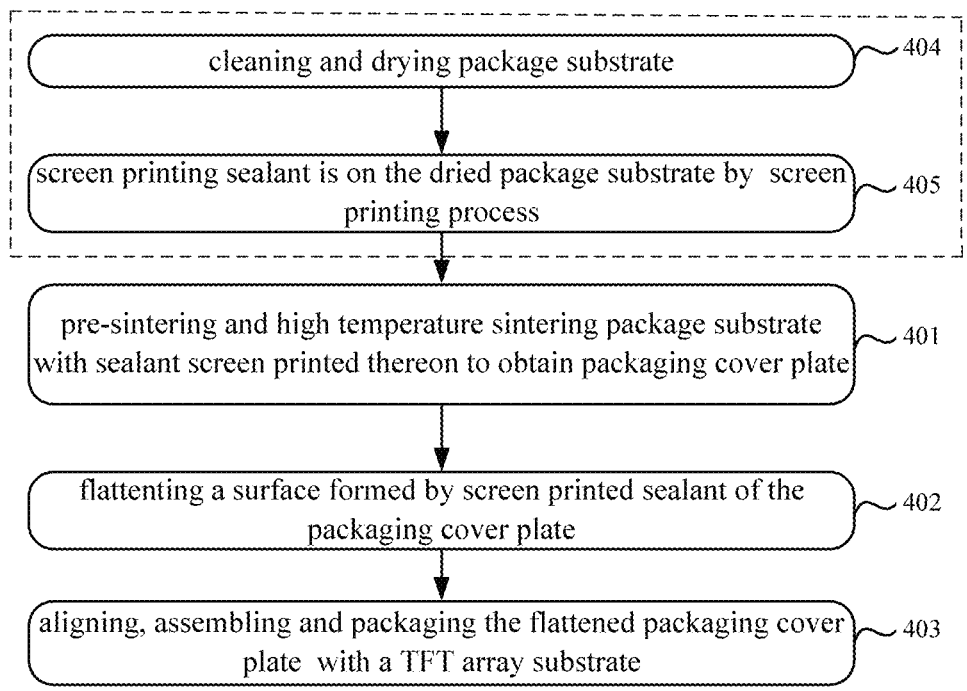
FIG. 10 is schematic flowchart of another packaging method according to embodiments of the present invention.

In addition, as shown in FIG. 10, before step 401, the method may further comprise the following steps:

In Step 404, the package substrate is cleaned and dried.

Specifically, the package substrate of the present invention is not limited to a silicide structure such as a glass substrate or the like. Meanwhile, existing cleaning and drying operations may be applied to clean and dry the package substrate.

In Step 405, the sealant is screen printed on the dried package substrate by using the screen printing process.

Among others, the materials sealant include UV-curing adhesive glue and frit glue (glass glue), and since the frit glue is mixture of inorganic glass and organic matter (organic solvent and resin), the sealant is usually screen printed on the package substrate by screen printing process.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method for flattening a surface formed by screen printed sealant of a packaging cover plate, the surface comprising a convex portion and a concave portion formed by the sealant, the packaging cover plate including a package substrate on which the sealant is formed, the method comprising steps of:

placing the packaging cover plate after being high temperature sintered on an ultrasonic vibrator with a preset frequency, so that a first surface of the package substrate opposite to the surface formed by screen printed sealant contacts a surface of the ultrasonic vibrator; and controlling at least one laser with preset power to emit a laser beam to only irradiate convex portions of the surface formed by screen printed sealant of the packaging cover plate and adjusting a height of the laser to firstly irradiate and melt a highest one of the convex portions on the surface formed by screen printed sealant and then irradiate and melt a highest remaining one of the convex portions on the surface, so that the melted sealant at the convex portion flows to the concave portion under vibration of the ultrasonic vibrator, thereby flattening the surface formed by screen printed sealant of the packaging cover plate, wherein the laser beam extends in a direction parallel to the first surface of the package substrate.

2. The method of claim 1, wherein the step of controlling at least one laser with preset power to irradiate the surface formed by screen printed sealant of the packaging cover plate comprises:

controlling two lasers with preset power to irradiate the surface formed by screen printed sealant of the packaging cover plate, wherein the two lasers are respectively aligned with the convex portion and the concave portion of the surface formed by screen printed sealant of the packaging cover plate, an extending direction of the lasers is parallel to the first surface of the package substrate, and the two lasers move in the same and constant speed along the packaging cover plate.

3. The method of claim 2, wherein the moving speed of the lasers is 23 mm/min.

4. The method of claim 2, wherein the preset power of the lasers is 5 to 60 watts.

5. The method of claim 2, wherein heights of the lasers are adjustable so that after a highest section of the convex portion is irradiated and melted, other sections of the convex portion are irradiated and melted by the lasers.

6. The method of claim 5, wherein the step of controlling two lasers with preset power to irradiate the surface formed by screen printed sealant of the packaging cover plate comprises:

using a step profiler to map out an image of the surface formed by screen printed sealant in real time so as to obtain height values of the convex portion and the concave portion, and determining the heights of the lasers respectively according to the height values of the convex portion and the concave portion; and using a regulator to adjust the heights of the two lasers respectively according to the determined heights of the two lasers with preset power, so that the convex portion of the surface formed by screen printed sealant is sufficiently melted.

7. The method of claim 6, wherein the step of using a step profiler to map out an image of the surface formed by screen printed sealant in real time so as to obtain height value of the convex portions and the concave portions comprises:
obtaining a height value of the highest section of the convex portion and a height value of a lowest section of the concave portion of the surface formed by screen printed sealant of the packaging cover plate, and then transmitting them to the regulator.

8. The method of claim 6, wherein the step of adjusting the heights of the two lasers with preset power comprises:
adjusting the height of one laser to be the same as the height of the highest section of the convex portion of the surface formed by screen printed sealant and adjusting the height of the other laser to be the same as the height of a lowest section of the concave portion of the surface formed by screen printed sealant.

9. A surface planarization processing system, comprising an ultrasonic vibrator and at least one laser with preset power;
wherein, said at least one laser is configured to emit a laser beam to only irradiate convex portions of a surface formed by screen printed sealant of a high temperature sintered packaging cover plate, so that the convex portions of the surface formed by screen printed sealant are melted, the packaging cover plate including a package substrate on which the screen printed sealant is formed, the laser beam having an extending direction parallel to a first surface of the package substrate, and at least one of said at least one laser has an adjustable height and is configured to irradiate and melt a highest one of the convex portions on the surface formed by screen printed sealant, adjust a height of the laser, and then irradiate and melt a remaining highest one of the convex portions on the surface formed by screen printed sealant; and
the ultrasonic vibrator is configured to carry the packaging cover plate and contact the first surface of the package substrate opposite to the surface formed by the screen printed sealant, and to vibrate the packaging cover plate, to cause the melted sealant to flow to a concave portion of the surface formed by screen printed sealant, thereby flattening the surface formed by screen printed sealant of the packaging cover plate.

10. The system of claim 9, wherein the system comprises two lasers with preset power, wherein said two lasers are configured to be respectively aligned with one of the convex portions and the concave portion of the surface formed by screen printed sealant of the packaging cover plate, and the two lasers are further configured to move in the same and constant speed along the packaging cover plate.

11. The system of claim 10, wherein the system further comprises:
a step profiler for mapping out an image of the surface formed by screen printed sealant in real time so as to obtain height values of one of the convex portions and the concave portion of the surface, and determining the heights of the two lasers respectively according to the height values of the one of the convex portions and the concave portion; and
a regulator for adjusting the heights of the two lasers respectively according to the determined heights of the two lasers, so that the one of the convex portions of the surface formed by screen printed sealant is sufficiently melted.

12. The system of claim 10, wherein the preset power of the lasers is 5 to 60 watts.

13. The system of claim 10, wherein the moving speed of the lasers is 23 mm/min.

14. A packaging method, comprising:
pre-sintering and high temperature sintering a package substrate with sealant screen printed thereon to obtain a packaging cover plate;
flattening a surface formed by screen printed sealant of the packaging cover plate by performing the method of claim 1; and
aligning and assembling the flattened packaging cover plate with a TFT array substrate, and packaging the assembled packaging cover plate and TFT array substrate.

15. The method of claim 14, wherein before the step of pre-sintering and high temperature sintering the package substrate with sealant screen printed thereon, the method further comprises:
cleaning and drying the package substrate; and
screen printing the sealant on the dried package substrate by using a screen printing process.

* * * * *